United States Patent
Richter

(10) Patent No.: US 7,855,566 B2
(45) Date of Patent: Dec. 21, 2010

(54) SENSOR DEVICE

(75) Inventor: Wolfgang Richter, Starnberg (DE)

(73) Assignee: Ident Technology AG, Ssling (DE)

(*) Notice: Subject to any disclaimer, the term of this patent is extended or adjusted under 35 U.S.C. 154(b) by 226 days.

(21) Appl. No.: 12/280,195

(22) PCT Filed: Feb. 22, 2007

(86) PCT No.: PCT/EP2007/001542

§ 371 (c)(1),
(2), (4) Date: Sep. 24, 2008

(87) PCT Pub. No.: WO2007/096166

PCT Pub. Date: Aug. 30, 2007

(65) Prior Publication Data

US 2009/0033342 A1    Feb. 5, 2009

(30) Foreign Application Priority Data

Feb. 22, 2006   (DE) .................. 10 2006 008 281

(51) Int. Cl.
   *G01R 27/26*   (2006.01)
(52) U.S. Cl. .................... 324/687; 324/681
(58) Field of Classification Search .............. 324/658, 324/674, 681, 683, 691
   See application file for complete search history.

(56) References Cited

U.S. PATENT DOCUMENTS

| 5,594,222 A | 1/1997 | Caldwell ............. 200/600 |
| 2002/0057020 A1 | 5/2002 | Caldwell ............. 307/112 |
| 2003/0085679 A1 | 5/2003 | Bledin et al. ........ 318/264 |
| 2005/0243246 A1* | 11/2005 | Edwards et al. ....... 349/98 |
| 2006/0117862 A1 | 6/2006 | Shank et al. ........ 73/780 |
| 2006/0260417 A1* | 11/2006 | Son et al. ........ 73/862.046 |

FOREIGN PATENT DOCUMENTS

| DE | 2521388 | 11/1976 |
| EP | 1277907 | 1/2003 |

* cited by examiner

*Primary Examiner*—Vincent Q Nguyen
(74) *Attorney, Agent, or Firm*—Alfred Wilford

(57) ABSTRACT

A sensor system has a support that extends along an observation zone, a row of detection subassemblies arranged one after another on the support and having subcircuits for capturing detection events within respective observation subzones defined by the respective detection subassemblies, and a base circuit on the support. The detection subassemblies are controlled with an alternating voltage having a frequency that forms a carrier frequency based on which a signal dialog occurs between the subcircuits and the base circuit.

13 Claims, 4 Drawing Sheets

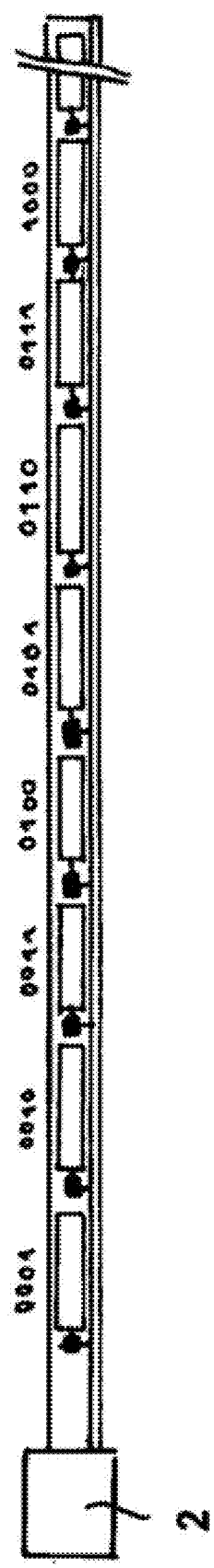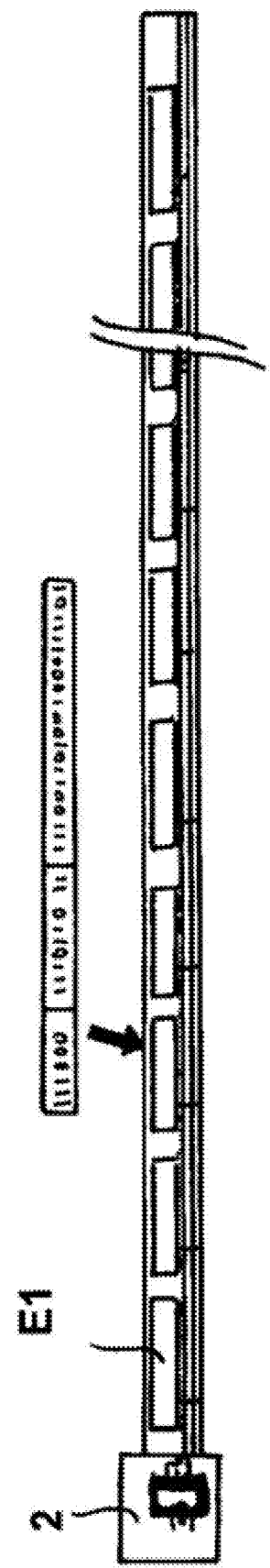
Fig.4a
Fig.4b

SENSOR DEVICE

CROSS REFERENCE TO RELATED APPLICATIONS

This application is the US national phase of PCT application PCT/EP2007/001542, filed 22 Feb. 2007, published 30 Aug. 2007 as WO2007/096166, and claiming the priority of German patent application 102006008281.8 itself filed 22 Feb. 2006, whose entire disclosures are herewith incorporated by reference.

FIELD OF THE INVENTION

The invention relates to a sensor system for generating signals that provide information as to whether an object, particularly limbs of a person, is present within an observation zone.

BACKGROUND OF THE INVENTION

Such sensor systems are used particularly for protecting hazardous regions, motor-driven doors, hatches and vehicle convertible tops.

OBJECT OF THE INVENTION

The object of the invention is to create a sensor system that makes it possible to generate particularly informative measuring signals with respect to the presence of an object in an observation zone.

SUMMARY OF THE INVENTION

According to the invention, this object is attained by a sensor system having a support that extends along an observation zone, a row of detection subassemblies on the support capturing detection events within an observation subzone defined by the respective detection subassembly.

Thus it is advantageously possible to create a monitoring circuit by means of which an observation zone extending along a longer edge zone, for example a closing edge, can be monitored with particular precision, subdivided into small subzones. It is possible to configure and to operate the individual detection subassemblies such that the respective observation subzones associated with the respective detection subassemblies overlap one another. Thus, it is possible to avoid any gaps between the observation subzones.

According to a particularly preferred embodiment of the invention, the individual detection subassemblies are configured such that they can be controlled by addressing or also queried by addressing. By addressing or querying, it is possible to control the individual detection subassemblies such that the individual observation subzones are activated or queried according to a defined run pattern, particularly in a time-shifted manner.

It is also possible to configure the circuits of the individual detection subassemblies such that it can be determined whether an adjacent detection zone was activated, the existing observation subzone being only activated if the preceding observation subzone was active for a defined time period or a defined number of oscillation cycles.

The individual detection subassemblies are preferably configured such that they each comprise components of a RC and/or LC network. The individual detection subassemblies can be configured such that they each comprise at least one electrode configured and disposed such that changes of the field-electric properties within the respective observation subzone influence the capacitance of a capacitor system that is at least partially formed by the electrode.

It is also possible to configure the detection subassemblies such that the respective electrode thereof serves ultimately the purpose of capturing changes of an electric field within the respective observation subzone. The local detection circuit can also be configured such that it detects both the level changes and changes of the dielectric properties of the environment.

The observation zone can comprise systems for generating an electric field so that such fields are detected by the detection subassemblies, particularly when they are changed by an object to be detected. It is possible to operate opposing detection subassemblies such that they alternately act as field sources and as field detectors.

It is possible to configure the sensor system according to the invention such that each detection subassembly monitors the respective observation zone for a defined number of oscillation cycles, or until a forwarding signal is received. It is possible to arrange a local circuit in the region of each detection subassembly, the local circuit allowing control of the individual detection subassemblies by an alternating voltage that preferably has a carrier frequency, based on which a signal dialog is processed between the respective circuits of the individual observation subzones and a base circuit.

It is possible to configure the circuit structures associated with the respective observation subzones such that based on them different approach statuses can be detected. Particularly, it is possible to operate or query the local circuits such that they deliver results for different intervals.

One embodiment of the sensor system according to the invention having a circuit design that is relatively easy to implement is characterized in that the circuit structures associated with the individual observation subzones can be connected to a base line in an addressed manner. The appropriate circuits are preferably provided directly between the base line and the electrode circuit. It is also possible per se to operate each observation zone independently and to read out the captured measuring signals via a read signal frequency. It is possible to configure the local circuits associated with the individual observation subzones such that the operating characteristic thereof can be altered according to a signal frequency, particularly that it can be defined by programming.

The sensor system according to the invention can be used particularly advantageously in the automotive field for observing potentially hazardous zones, particularly closing gap zones. It is also suited for monitoring a region surrounding the vehicle. It is particularly possible to arrange the sensor system according to the is invention in a side region of the vehicle and in the region of a vehicle bumper and in this way create an "artificial side line" to be able to completely monitor the ambient region of the vehicle, as is possible with fish, substantially in the horizontal direction.

The sensor system according to the invention can also serve as a security or control system for stationary fixtures, particularly door and window equipment (revolving doors, sliding doors). The detection occurs preferably based on field-electric interaction effects, particularly capacitance changes of a capacitor system at least partially formed by a detection electrode.

BRIEF DESCRIPTION OF THE DRAWING

Further details and characteristics of the invention will be apparent from the following description in conjunction with the drawing. Therein:

FIG. 4b is another schematic drawing illustrating a sensor system comprising individual sensor sections that can be controlled by addressing and configured based on signals with respect to the operating behavior.

SPECIFIC DESCRIPTION

Figure 1:
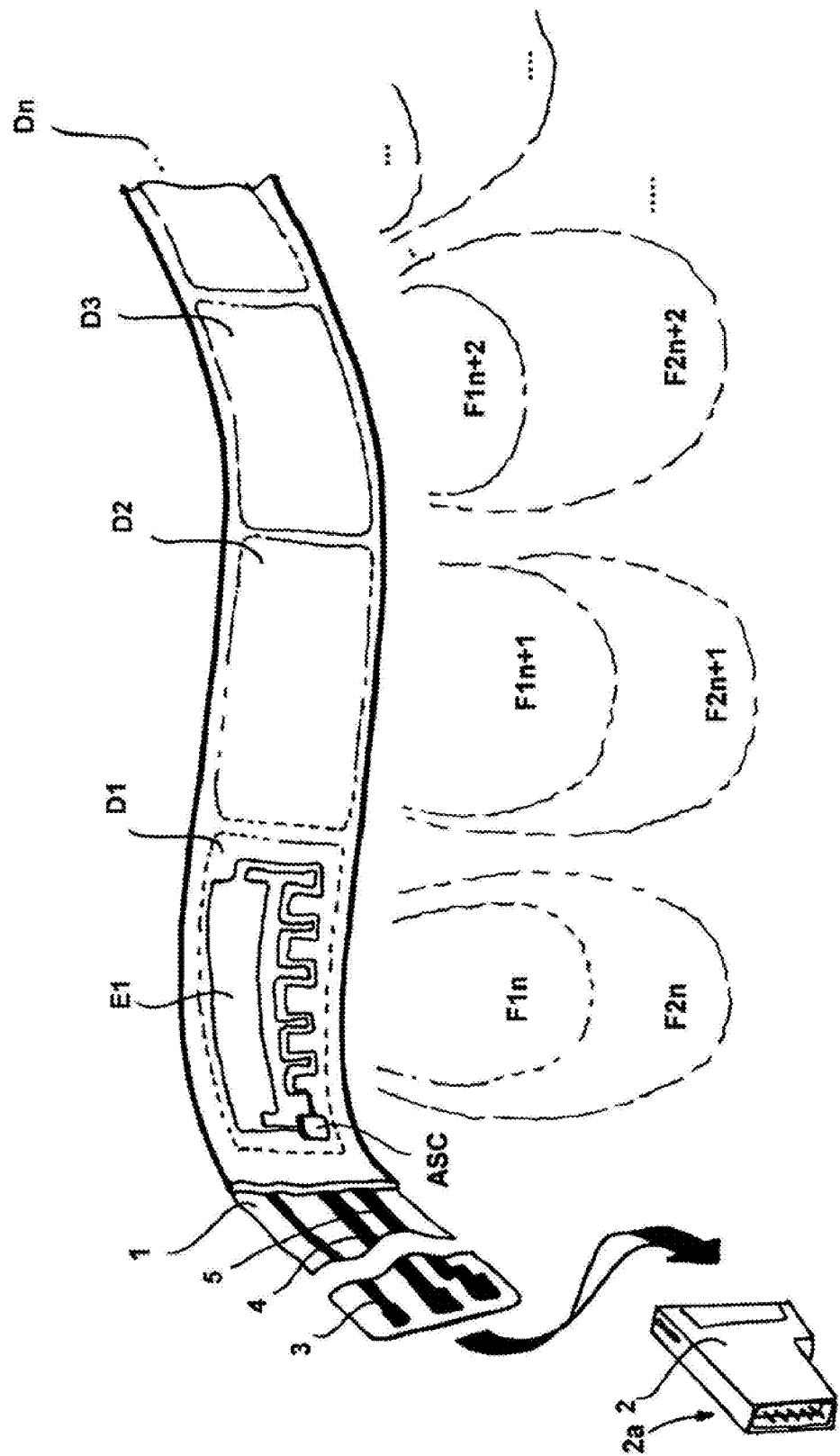
FIG. 1 is a simplified illustration showing the layout of a sensor system according to the invention configured as a tape structure forming a row of observation circuits.

FIG. 1 shows a sensor system according to the invention that comprises as such a support 1 produced by a flexible circuit board, the structure extending along the edge of an observation zone. On the support, a row of detection subassemblies D1, D2, Dn are configured in order to capture detection events within respective observation subzone F1, F2 defined by the detection subassembly D1, D2, D3 . . . Dn. The detection subassemblies can be configured such that their lengths are in the range from 25 to 100 mm, preferably 60 mm. Depending on application, also smaller or larger divisions can be used.

In the embodiment shown here, the detection subassemblies D1, D2, D3 . . . Dn can be controlled by addressing and in addition queried by addressing. Control of the individual detection subassemblies D1, D2 . . . Dn can occur according to a defined run pattern, so that the individual detection subassemblies, for example, are activated and/or queried in chronological order.

The individual detection subassemblies are formed by components of an RC or LC network and comprise at least one electrode E1 in the embodiment shown here, the electrode being configured and arranged such that it can be used to detect changes of the field-electric properties, particularly the dielectricity within the respective observation subzone F1, F2. Such changes can particularly be captured by integrating the electrode in the appropriate circuit such that the change of the field-electric properties within the respective observation subzone F1, F2 influences the capacitance of a capacitor system formed by such integration of the electrode E1. The capacitance change can be captured by accompanying effects within the oscillation circuit, such as frequency changes, amplitude changes of the current or the voltage, and changes of the resonance behavior. It is also possible to configure the respective circuit in the detection subassembly such that preferably the strength of an electric field within the observation subzone F1, F2 (feeding field capturing) can be captured via these changes.

The control of the individual detection subassemblies D1, D2, D3 . . . Dn occurs preferably such that each detection subassembly monitors the associated observation zone F1, F2 for a defined number of oscillation cycles, and then the next detection subassembly is activated until it also has completed a certain number of oscillation cycles.

It is possible to configure the circuit structures provided in the individual detection subassemblies such that they form an operational detection circuit that is independent per se, by which the respectively associated observation subzones can be monitored. It is also possible to configure the individual subcircuits such that they only have those circuit structures that are necessary in order to perform an observation of the observation subzone F1, F2 associated with the respective circuit via the control event. It is possible to control the individual circuit systems that are arranged on the support one after the other by an alternating voltage, a carrier signal being provided at the same time by this alternating voltage, based on which a signal dialog can occur, for example in the QPSK, ASK or FSK method using a base circuit.

It is possible to configure the circuits of the individual detection subassemblies such that in their zones signal processing is performed based on which the determination can be made if an approach state of an object exists or not It is possible to describe a captured approach state by a data record and to transmit the data record to the base circuit, or to make it available for querying.

It is possible to configure the individual detection subassemblies such that their detection properties can be changed in a controllable manner. The change can particularly occur by generating a control signal sequence such that it has a defined content triggering programming or configuration of the local detection circuit.

In the embodiment shown here, the base circuit is accommodated in a housing 2 that can be attached to an end section of the support 1, the section carrying conductor tracks 3, 4, 5. The housing 2 is configured in the embodiment shown here such that a further connector plug section 2a is provided that can be coupled to a supply and data cable plug.

The base circuit can particularly be configured such that the total supply power necessary for operating the sensor system can be hooked up via the connecting plug 2a. The connecting plug can particularly be configured as a USB plug, the total operating power being provided by the USB system. The base circuit can furthermore be configured such that the measuring signals captured therewith can be supplied in a standardized manner such that they can be read by means of the USB cable in a signal standard suitable therefor.

The subcircuits forming the individual detection subassemblies D1, D2, D3 . . . Dn in the embodiment shown here each comprise at least one electrode E1 that can preferably be configured as a flat electrode or also as a wire electrode. This electrode forms part of an RC or LC network that can capture changes of the dielectric properties in the environment of the respective electrode E1, or also field changes, or field strengths ("levels"). Each subcircuit comprises a control circuit ASC configured as an ASIC (application specific integrated circuit), and, optionally additional electronic components, in the embodiment shown here. The individual subcircuits have an extremely flat design and are preferably configured substantially as printed structures. They can be arranged on a vehicle body beneath the paint, or more particularly embedded in the profiled seals.

The ASIC ASC can be configured such that it can be used to control the respective subcircuit by addressing, or query the circuit by addressing with respect to the detection results thereof. Furthermore, the ASIC is preferably configured such that the ASIC can operate the respective subcircuit in different operating modes. These operating modes can particularly be configured such that different detection ranges are provided, as illustrated here by the cone-shaped zones. The conical or spheroidal observation subzones can also be superimposed.

Figure 2:
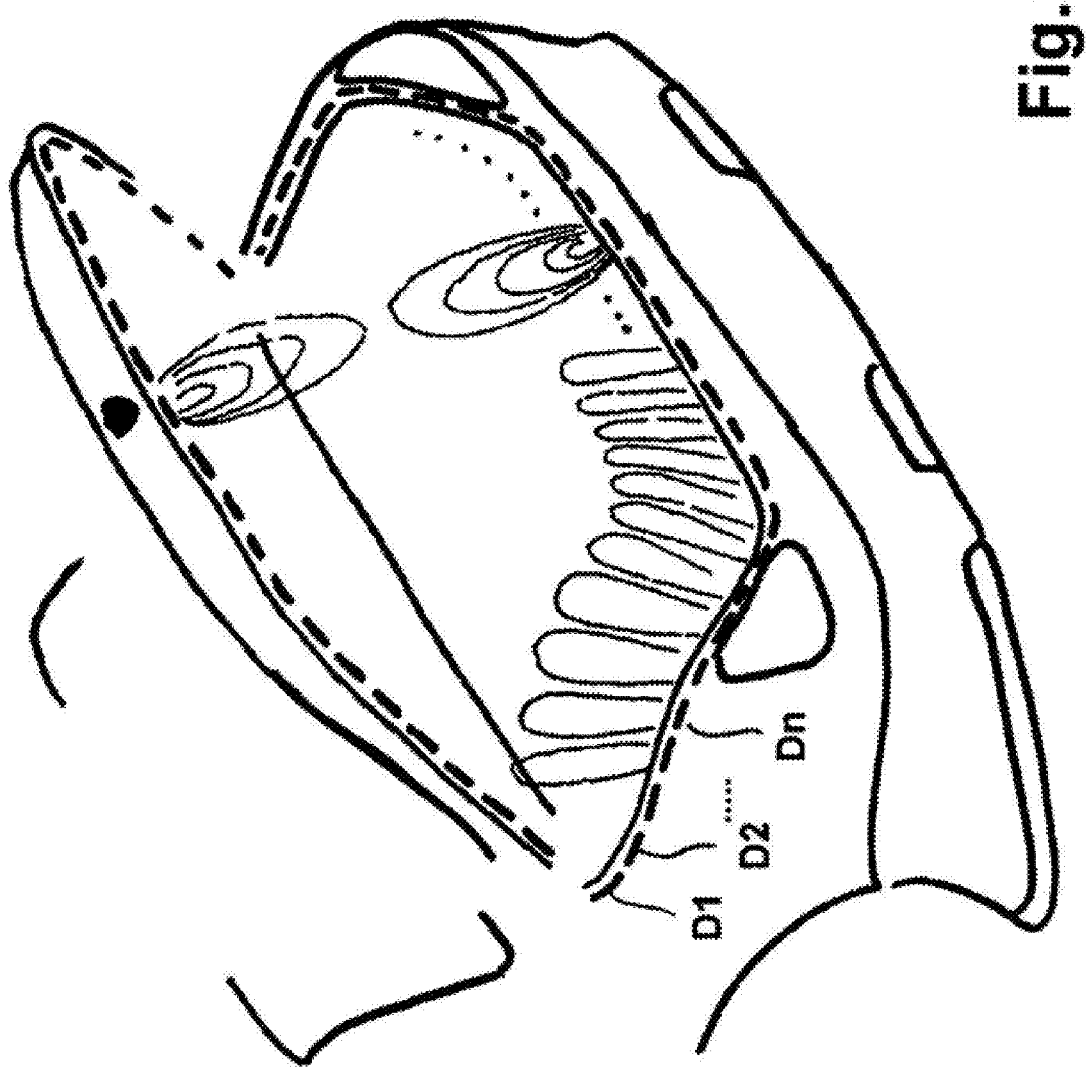
FIG. 2 is a perspective view illustrating an application of the sensor system according to the invention as a pinch guard system on a trunk lid of a vehicle.

In FIG. 2, the closing edge region of a trunk lid of a motor vehicle is illustrated by way of example. A sensor system according to the invention is arranged in the immediate vicinity of the closing edge region of the trunk lid, as is indicated by the dotted lines in this illustration. The individual lines of the dotted lines correspond to the detection subassemblies D1, D2 . . . Dn described above in conjunction with FIG. 1.

The detection subassemblies D1, D2, D3 . . . Dn can also be controlled by addressing, or queried by addressing in this embodiment. The detection subassemblies are activated or queried in a time-shifted manner according to a defined run pattern. The individual detection subassemblies D1, D2 . . . Dn comprise, as described above, oscillation circuit components. The detection subassemblies D1, D2 . . . Dn are each operated for a time of 0.025 seconds, for example, and during this time preferably complete at least 400 oscillation cycles. The field-electric properties in the zone of the respective detection subassembly, particularly the presence of an object in the respective observation zone, can be captured based on a wide variety of effects of the object on the dielectric properties in the respective observation zone.

Figure 3:
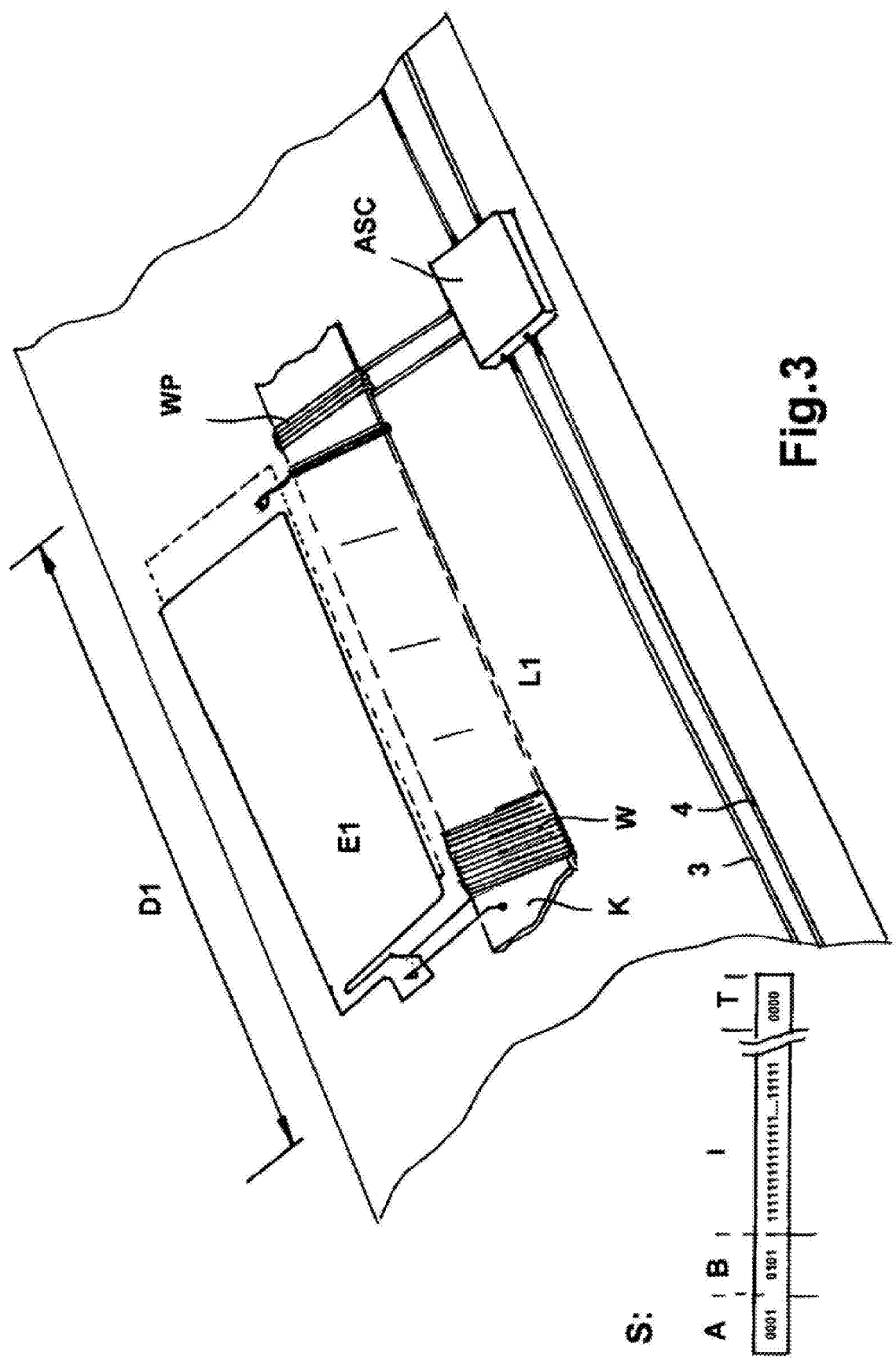
FIG. 3 shows a coil assembly of an observation subcircuit according to the invention, FIG. 4a schematically shows the configuration of a sensor system according to the invention comprising individual sections that can be controlled by addressing, or individual sections that can be queried by addressing.

In FIG. 3, a very simplified detection subassembly D1 is illustrated as a flat assembly. This detection subassembly D1 is formed by a subcircuit that comprises an electrode E1 and a coil L1 in the embodiment shown here. The coil L1 has a winding W wound on a ferromagnetic core K. The coil L1 acts as a transmitter in this embodiment and comprises a primary winding WP that can induce a magnetic field in the coil core K. The primary winding WP is also connected to the control circuit ASC configured here as an ASIC and supplied by same with alternating voltage. The control circuit ASC is located on a supply voltage line, which here comprises only two lines 3 and 4 and functions at the same time as a control line. For example, an operating signal can be applied to line 3, the signal comprising an address A, operating mode information B and a sequence of work impulses I. A specific ASC of the sensor system according to invention can be accessed via the address A and then directly assume a switching state that is specified by the operating mode signal B. According to this switching state B, the primary winding WP can then be connected directly to the supply lines 3 and 4 and the signal (work impulses I) can be applied thereto. This operating state can be terminated once the signal S includes a shut-off signal sequence T that is recognized by the control circuit ASC. The subcircuit provided according to the invention is illustrated and described here only much more simplified. It can comprise a number of further electronic components that are preferably configured as printed structures. The electrode E1 comprises a counterelectrode that here is indicated only by dash-dotted lines and which is arranged on the back of the support that acts as a dielectric. The number of work impulses can be changed upon the occurrence of a detection event, so that the resolution of the sensor system according to the invention is dynamically increased in the presence region of an object. The remaining zones can then be operated with lower resolution, such as fewer oscillation cycles, until the cycles optionally also indicate presence-indicating states.

In FIG. 4a a sensor system according to the invention is shown that comprises a base circuit in a housing 2, to which an electrode carrier strip is attached that is divided into a number of individually addressable partitions and configured in a flat design. The individual subcircuits have local control circuits that are indicated here by black rectangles and implemented by an ASIC, the control circuits controlling the individual subcircuits by addressing. The individual subcircuits are designed in the embodiment shown here such that they each have a separate high-voltage circuit.

In variant 4b, the individual subcircuits have electrodes E1, E2 . . . that can be controlled by addressing. The base component of the oscillation circuit, particularly the R or L element, however, is still located near the housing 2. The housing 2 is designed such that it can be connected to a computer system via a standard interface, particularly a USB connector, and the computer system can be used to further process, by signaling technology, the measuring results obtained in the individual sections and to control additional processes.

Analysis of the measuring signals can be done according to a wide variety of concepts. Particularly, it is possible to classify deviations of the changes of the signal levels from an anticipated change as relevant detection events.

The control pattern of the individual sections can be adjusted such that a particularly defined and reliable detection is guaranteed.

A signal transfer can also be handled by the sensor system according to the invention, such as for conducting an authorization inspection. The sensor system according to the invention can also act as a pinch guard and as a signal interface. The signals can be generated by a mobile identification circuit to be carried by the user, the identification circuit generating an alternating field modulated according to a data set, the field being detectable by the sensor system. Signals can also be generated from the sensor system, the signals being detectable by the mobile component or another reading system, and data can be processed.

An interface can be created via the sensor system, or circuit device in general, according to the invention for handling a wide variety of signal-transmission processes, such as for coordinating value settings when fueling a vehicle.

Particularly when using the sensor system according to the invention as an ambient monitoring system for a motor vehicle, it is possible to monitor, for example a trunk lock, or a tank cap latch, based on the evaluation of the signals of the sensor circuit according to the invention.

If, for example, the driver's door is opened, and the sensor circuit detects movement of an object (the driver) from the door region to the rear of the vehicle, opening of a trunk lid or a tank cap can be permitted without requiring active intervention by the user.

It is possible to detect movements of a user, particularly the arms and hands thereof, with high resolution via the sensor system according to the invention. The signals can be used for signal processing, by which gesture interpretation and circuit signal generation based thereon can be handled.

The invention claimed is:

1. A sensor system comprising:
    a support that extends along an observation zone;
    a row of detection subassemblies arranged one after another on the support and having respective subcircuits for capturing detection events within respective observation subzones defined by the respective detection subassemblies;
    a base circuit on the support; and
    means for controlling the detection subassemblies with an alternating voltage having a frequency that forms a carrier frequency based on which a signal dialog occurs between the subcircuits and the base circuit.

2. The sensor system according to claim 1 wherein the detection subassemblies are controlled by the means by addressing.

3. The sensor system according to claim 1 wherein the detection subassemblies are queried by the means by addressing.

4. The sensor system according to claim 1 wherein the detection subassemblies are activated or queried by the means according to a run pattern in a time-shifted manner.

5. The sensor system according to claim 1 wherein the detection subassemblies are formed by components of an RC or LC network.

6. The sensor system according to claim 1 wherein the detection subassemblies each comprise at least one respective electrode configured and arranged such that changes of the field-electric properties within the respective observation subzone influence capacitance of a capacitor system that is at least partially formed by the electrode.

7. The sensor system according to claim 6 wherein the detection subassemblies each comprise at least one electrode configured and arranged such that changes of the electric field within each observation subzone can be detected by the respective electrode.

8. The sensor system according to claim 1 wherein each detection subassembly monitors the observation zone associated therewith for a defined number of oscillation cycles.

9. The sensor system according to claim 1 wherein the means processes signals in the region of the subcircuits associated with the respective observation subzones, based on which indicative signals can be generated with respect to different approach statuses.

10. The sensor system according to claim 1 wherein, in the region of the subcircuits associated with the respective observation subzones, a connection to a base line is established.

11. The sensor system according to claim 10 wherein the connection is prompted by the subcircuits associated with the respective observation subzones.

12. The sensor system according to claim 10 wherein the connection of the subcircuits associated with the respective observation subzones is prompted by a reading signal sequence.

13. The sensor system according to claim 12 wherein the means can change a detection effect of the detection subassemblies in a controlled manner via the reading signal sequence.

* * * * *